(12) United States Patent
Kraz

(10) Patent No.: US 10,263,591 B1
(45) Date of Patent: Apr. 16, 2019

(54) DEVICE AND METHOD FOR REDUCTION OF ELECTRICAL NOISE FROM PULSED SIGNAL DEVICES

(71) Applicant: OnFILTER, Inc., Santa Cruz, CA (US)

(72) Inventor: Vladimir Kraz, Santa Cruz, CA (US)

(73) Assignee: OnFILTER, Inc., Santa Cruz, CA (US)

(*) Notice: Subject to any disclaimer, the term of this patent is extended or adjusted under 35 U.S.C. 154(b) by 577 days.

(21) Appl. No.: 14/197,156

(22) Filed: Mar. 4, 2014

(51) Int. Cl.
| | | |
|---|---|---|
| *H03H 7/01* | (2006.01) | |
| *H03H 3/00* | (2006.01) | |
| *H03H 7/42* | (2006.01) | |
| *H03H 1/00* | (2006.01) | |

(52) U.S. Cl.
CPC ............ *H03H 7/0138* (2013.01); *H03H 3/00* (2013.01); *H03H 7/0115* (2013.01); *H03H 7/427* (2013.01); *H03H 1/0007* (2013.01); *H03H 2007/013* (2013.01)

(58) Field of Classification Search
CPC ........ H03H 1/0007; H03H 7/42; H03H 7/427; H03H 7/0115; H03H 7/0138
USPC .......................................... 333/12, 181, 185
See application file for complete search history.

(56) References Cited

U.S. PATENT DOCUMENTS

| | | | | | |
|---|---|---|---|---|---|
| 5,165,055 | A | * | 11/1992 | Metsler ................... | G06F 1/182 333/12 |
| 5,528,205 | A | * | 6/1996 | Wong ................... | H03H 1/0007 333/12 |
| 5,969,583 | A | * | 10/1999 | Hutchison .............. | H03H 7/427 333/12 |
| 2007/0236374 | A1 | * | 10/2007 | Brueske .............. | G01S 7/52028 341/143 |
| 2009/0043206 | A1 | * | 2/2009 | Towfiq ................. | A61B 8/0825 600/447 |
| 2012/0147509 | A1 | * | 6/2012 | Mechanic .............. | H02H 9/041 361/49 |
| 2014/0340171 | A1 | * | 11/2014 | Mechanic ........... | H03H 7/0115 333/177 |

OTHER PUBLICATIONS

"Sigma Electricals ", Apr. 25, 2016, http://www.sigmaelectricals.com/choke.htm, pp. 1-2.*
Erdman, J., et al., *Effect of PWM Inverters on AC Motor Bearing Currents and Shaft Voltages*, IEEE Transactions on Industry Applications (vol. 32, Issue: 2) 1996 (10 pages).
Kempski, A., *Capacitively coupled discharging currents in bearings of induction motor fed from PWM (pulse width modulation) inverters*, Journal of Electrostatics, vols. 51-52, May 2001, pp. 416-423 (8 pages).

(Continued)

*Primary Examiner* — Rakesh B Patel
(74) *Attorney, Agent, or Firm* — DLA Piper LLP (US)

(57) ABSTRACT

A device and method for reducing ground currents and electromagnetic interference in pulsed signal devices are described. In one embodiment, the device may include, in addition to regular filtering components and circuits, a separate noise-suppressing choke in the ground wire to reduce current in the ground wire that causes damage to bearings and electrical overstress. Such choke may be of a saturation type that offers high inductance and good noise-blocking properties in normal operating conditions and sufficiently low impedance at fail currents which provides proper tripping of safety circuits.

13 Claims, 21 Drawing Sheets

(56) References Cited

OTHER PUBLICATIONS

Tri-Mag, Inc. Data Sheet, *Three Phase WYE Filters, 250/440VAC, TPY Series*, Copyright © 2014 TRI-MAG, Inc. (1 page).
XTL-FA-01 Edge Filter for Xenus: User Guide Revision 3, Jun. 2008 (16 pages).

* cited by examiner

DEVICE AND METHOD FOR REDUCTION OF ELECTRICAL NOISE FROM PULSED SIGNAL DEVICES

FIELD

This disclosure generally relates to a device, system and method of reducing electrical noise resulting from operation of electric motors and their drive circuits, more specifically of servo, stepper, variable frequency and similar types of motors or actuators.

BACKGROUND

Servo, variable frequency, stepper and other similar types of electric motors and actuators ("pulsed signal devices") are driven by pulsed signals provided by special controllers, sometimes called amplifiers. The examples described further in this disclosure for simplicity and clarity relate to servo motors, however the same approach is applicable to other relevant types of motors and actuators.

Servo and similar motors are driven by pulsed signals where the properties of said signals determine rotation and position of the rotor of said motors. Most such drive signals utilize pulse-width modulation (PWM) where the drive signals are pulses with certain phase and frequency. FIG. 1A shows the typical application of a servo motor 10, a controller 20 and wires 30 that connect said amplifier to said motor. Servo controller is powered by either AC or DC voltage, shown as 40 in FIG. 1A. A typical servo motor is powered by three-phase pulsed drive signals generated by said servo controller. Variations in pulse width and phase shift of pulses determine rotor's position and rotation speed. A typical waveform of one phase of the drive signal of a servo motor is shown as 50 in FIG. 1B. A typical electrical noise generated by servo amplifier and transmitted into power line is shown as 60 in FIG. 1C.

A pulsed signal device, such as a servo, a variable frequency, a stepper and other similar types of electric motors and actuators, is ubiquitous in industrial automation since they allow for precise and controlled movement of equipment parts. One of main challenges in the use of pulsed signal devices is artifacts of drive signals. Specifically, the pulses that drive the motor having a typical repetition rate of 8 kHz to 20 kHz and may have very short rise and fall times as shown in FIG. 2A. The rise and fall times can be as short as tens of nanoseconds. Because drive voltage is high (the most common voltage is 200V with the range typically between 100 and 400V), dV/dt, or the rate of change of voltage over time can be very substantial. This creates several problems listed below in no particular order of significance.

First, the transmission of drive pulses from the controller to the motor is done via regular power cables with little or no consideration for high speed signals where high speed refers not to the frequency of the drive signal but rather to the spectrum of the rise and fall times of that signal. The output impedance of the servo controller typically does not match the impedance of the windings of the motor. All the above transforms sharp edges of the drive pulses into ringing signals with peaks higher than the amplitude of the pulses. FIG. 2b shows a display 120 of a typical ringing of the drive pulse. As seen, drive pulses 100 (only one phase shown for clarity) have repetition frequency of 12 kHz and amplitude of 200V in this case. As described above the rise and front edges of the drive pulses have overshoots and ringing shown as 110. The amplitude of the overshoot here is ~80V over the normal amplitude of the drive pulses. Signal 120 of FIG. 2B shows another example of artifact of sharp rise and fall edges where the overshoot reaches at least three times the normal drive signal amplitude. This causes reliability issues with the motor as described further.

Second, due to parasitic capacitive coupling between the windings of the motor and the rotor (described in "Capacitively coupled discharging currents in bearings of induction motor fed from PWM (pulsewidth modulation) inverters" by Adam Kempski, Journal of Electrostatics, 10/22/12 and in "Effect of PWM Inverters on AC Motor Bearing Currents and Shaft Voltages" by Jay Erdman, et. al., IEEE APEC Conference Dallas. Tex. March, 1995) sharp rise and fall times of drive pulses cause voltage on rotor and subsequent current to ground in the motor's bearing damaging and eventually destroying them. FIGS. 3A-3C illustrate this phenomenon with the drawings from the above and other sources. FIG. 3A depicts electric motor 150 with stator windings 160 and rotor 170. Parasitic capacitive coupling 180 between said rotor and stator acts as a conduit for high-frequency currents caused by sharp edges of drive pulses. This current 190 flows via ball bearings 200 to the motor frame and back to the servo controller. FIG. 3B shows typical voltage and current on said rotor. Although the current doesn't seem to be excessively high, due to its repetition rate it eventually causes damage to the ball bearings as depicted in FIG. 3C.

Third, the current in the ground circuits resulting from sharp rise and fall times of the drive pulses causes electrical overstress (EOS) to the sensitive components that may be processed by the equipment driven by servo motors (Electrical Overstress (EOS): Devices, Circuits and Systems by Steven Voldman, Wiley, 2014).

Fourth, the drive circuit of the servo controller generates significant electrical noise into the power line (typically AC power line) which causes serious interference problems with other equipment and issues with EMC (electromagnetic compliance).

Various known methods are used for mitigation of the above problems. For the noise problems between the servo controller and the motor, various servo motor filter solutions exist. For example, Copley Control's Xenus XTL-FA-01 edge filter provides an increase of dV/dt of the rise and fall times of the drive pulses on servo motors which reduces coupling voltages inside the motor and resulting bearing current. As another example, the TCI V1k motor protection filters (http://www.transcoil.com/Products/V1k.htm) is another solution to increasing dV/dt. There are other similar solutions on the market. While these existing filters offer an increase of dV/dt which decreases current through the motor bearings, they do not address reduction of this current directly.

For the mitigation of noise problems on supply AC lines and EMI problems, servo controller manufacturers recommend use of power line AC EMI filters as shown, for example, in Panasonic' Instruction Manual AC Servo Motor and Driver MINAS A4P Series, pages 28, 29 and similar documents.

The existing solution thus requires two filters—one between the servo controller and the motor and another filter between the servo controller and the power line feeding it as shown in FIG. 4A. This typical two filter approach creates a space problem because space in the tools that use servo motors is very limited as shown in typical installations as depicted in FIGS. 4A and 4A. In addition, the cost of the two filters in the two filter configuration may be high.

Thus, it is desirable to provide a method and a device to a) directly reduce current through the motor's bearings and to reduce physical space and cost associated with complete filtering of noise related to servo motor and amplifier operation.

DETAILED DESCRIPTION OF ONE OR MORE EMBODIMENTS

Figure 1A:
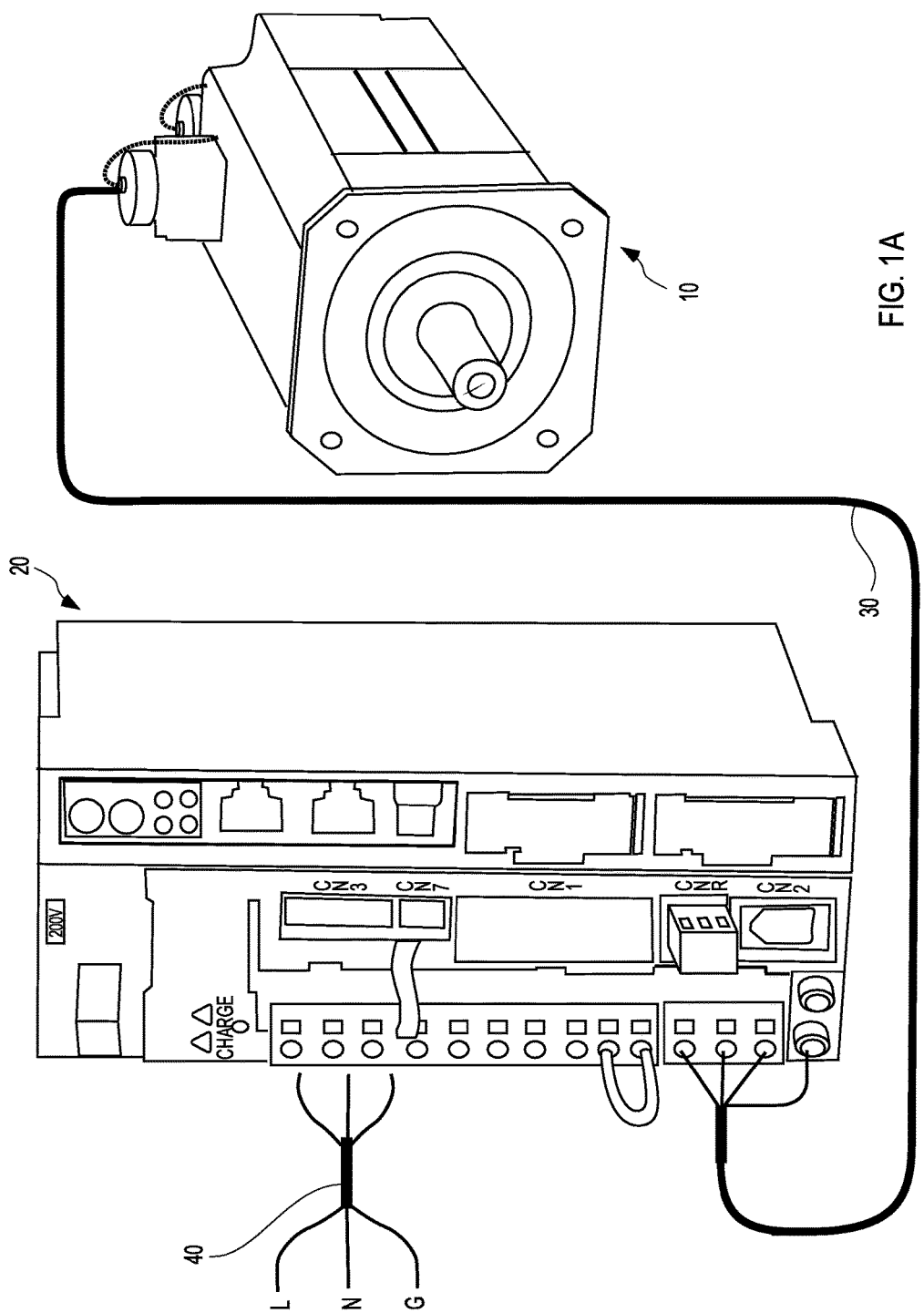
FIGS. 1A-1C are a diagram of typical connection of servo amplifier and servo motor and waveforms of the typical system.
Figure 1B:
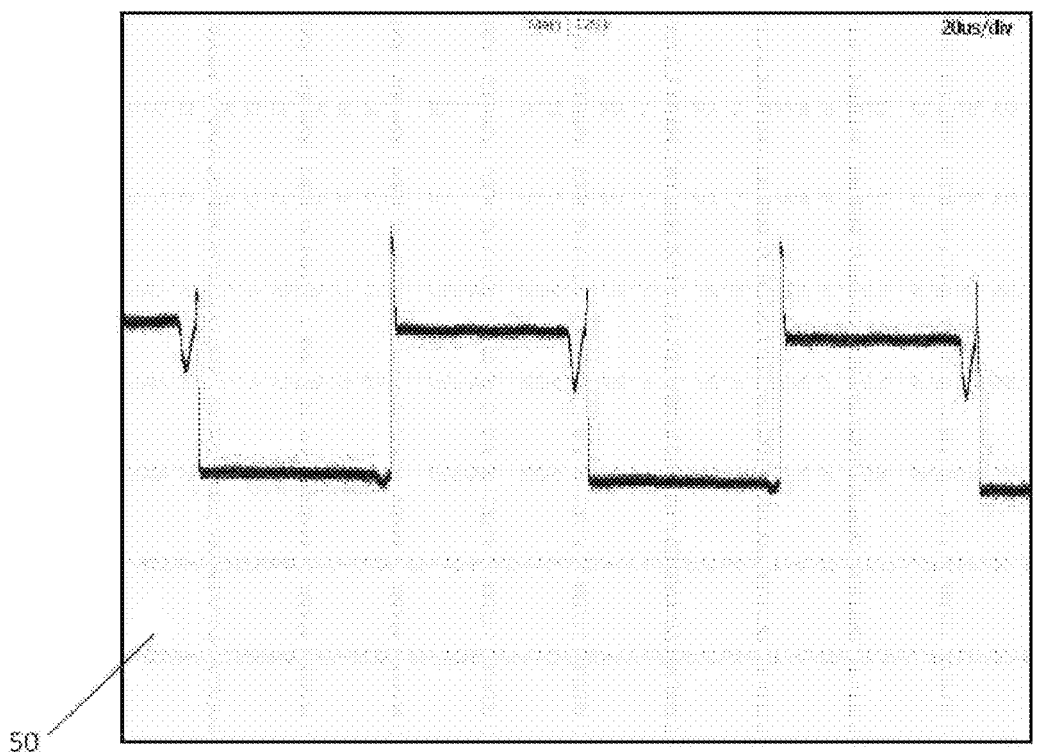
Figure 1C:
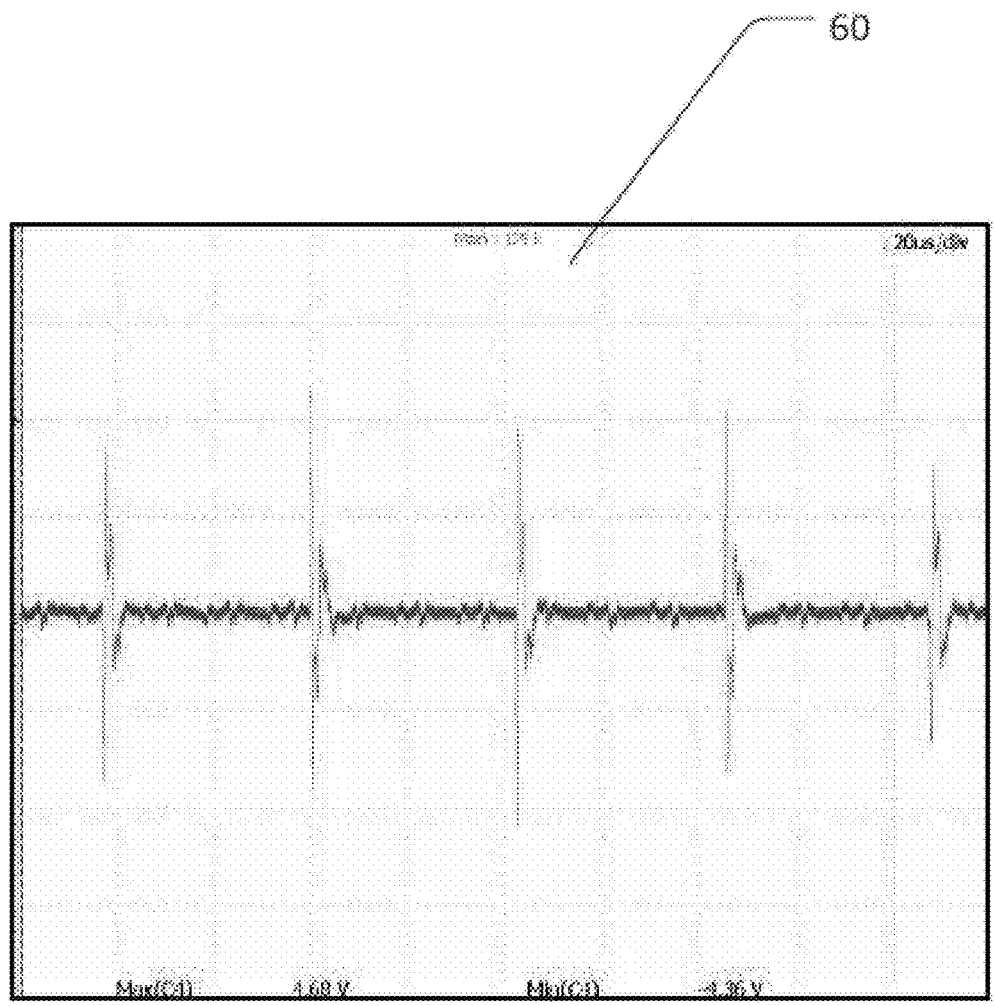
Figure 2A:
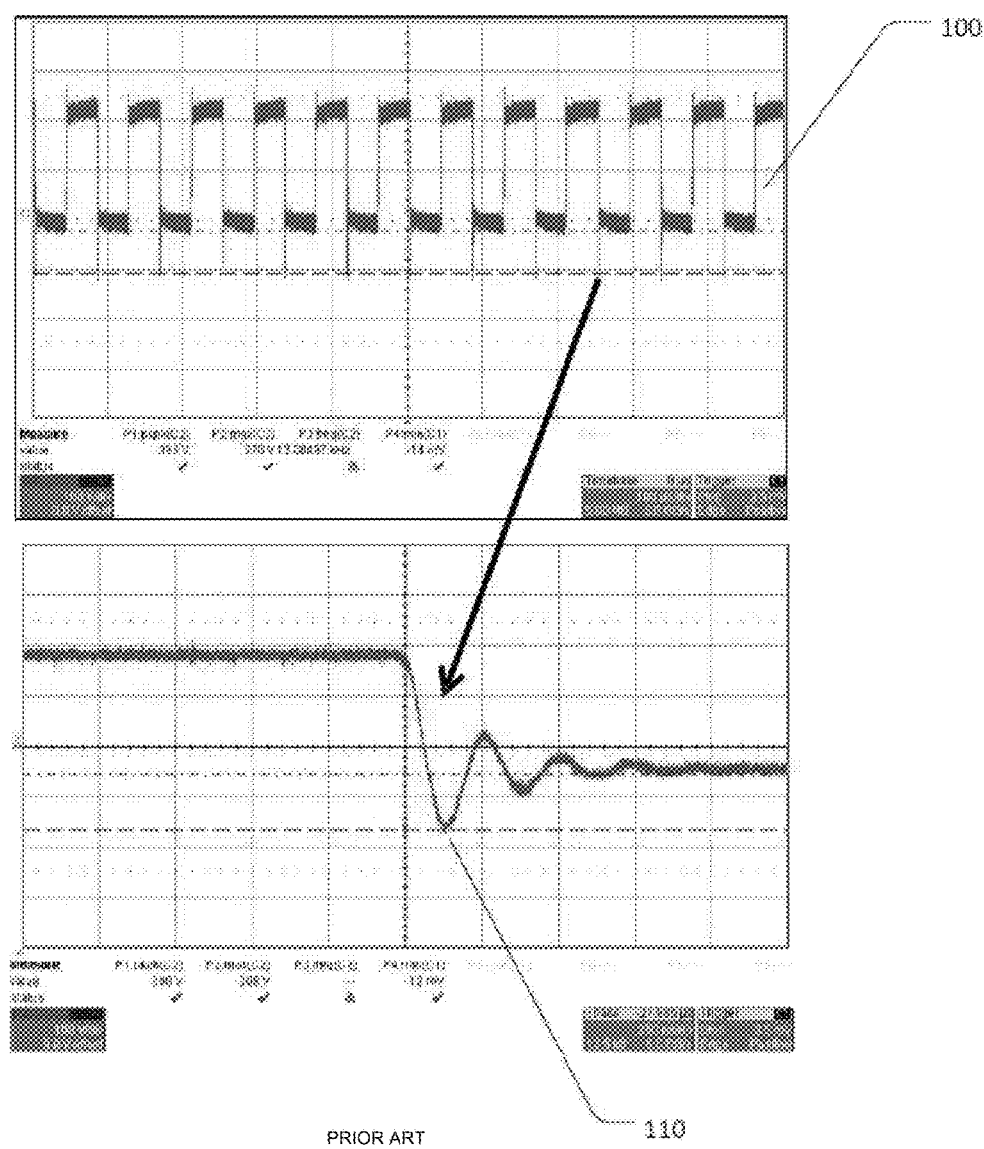
FIGS. 2A and 2B depict typical waveform artifacts on servo motor drive signals.
Figure 2B:
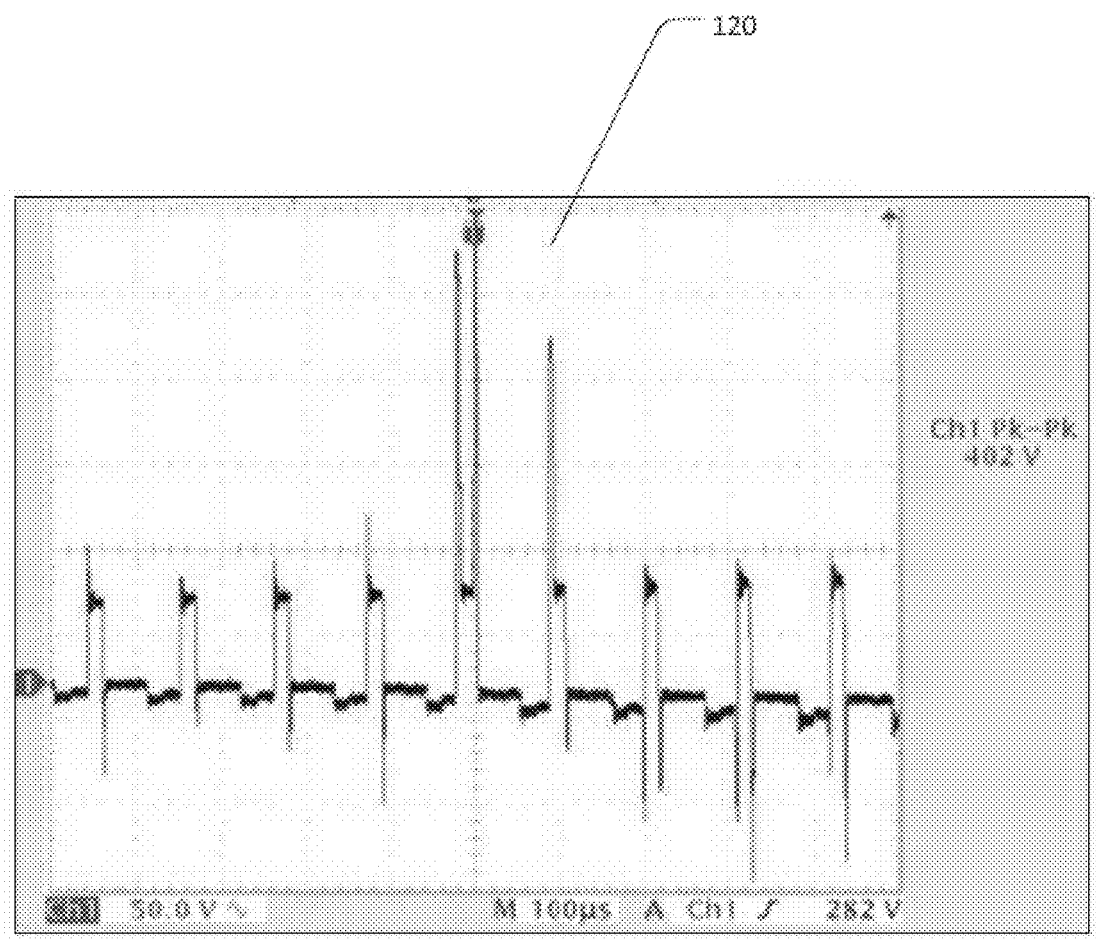
Figure 3A:
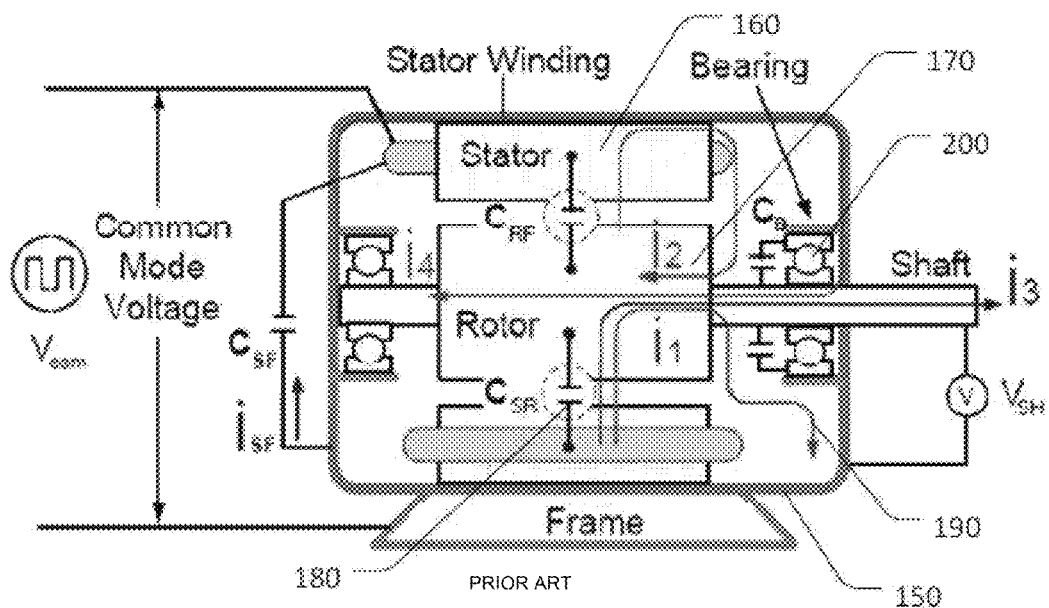
FIGS. 3A-3C illustrate an electric motor diagram, typical voltage and current on the rotor of the motor and the damage to the ball bearings, respectively.
Figure 3B:
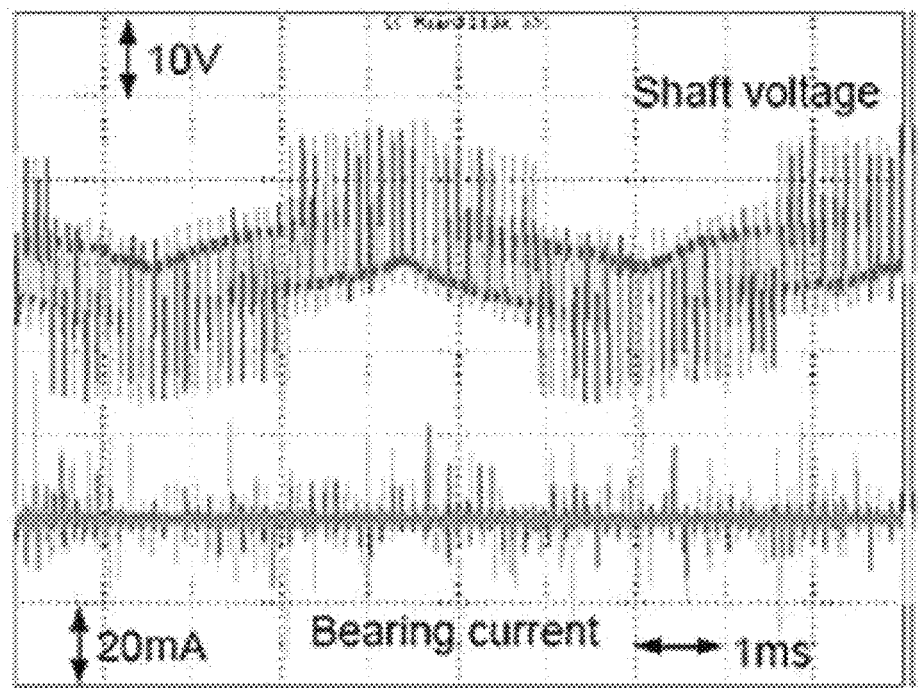
Figure 3C:
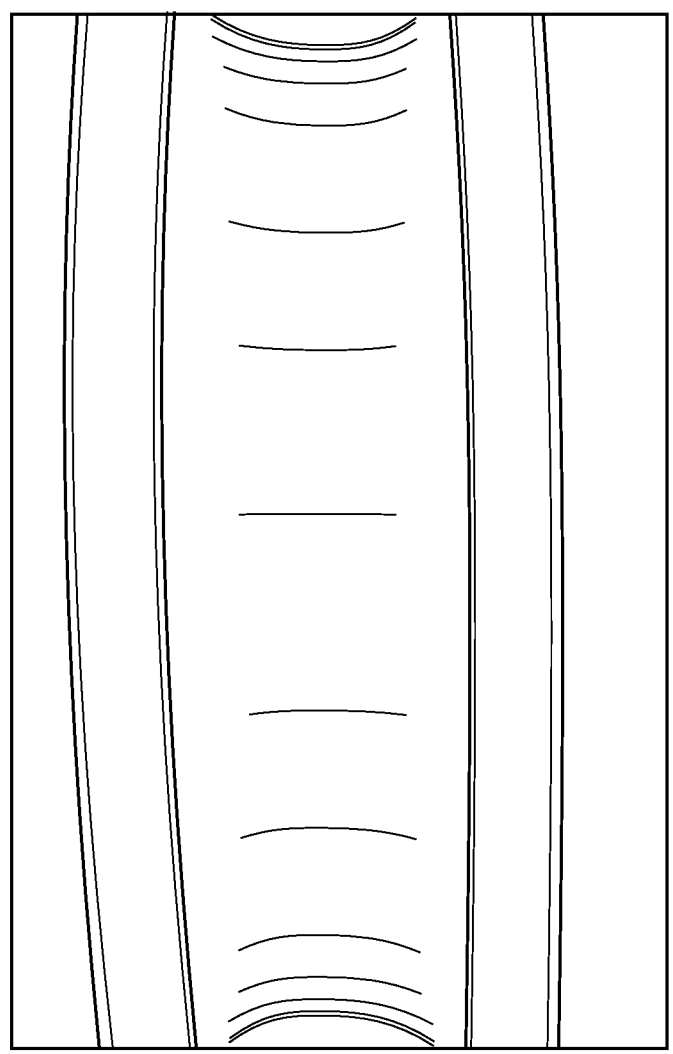
Figure 4A:
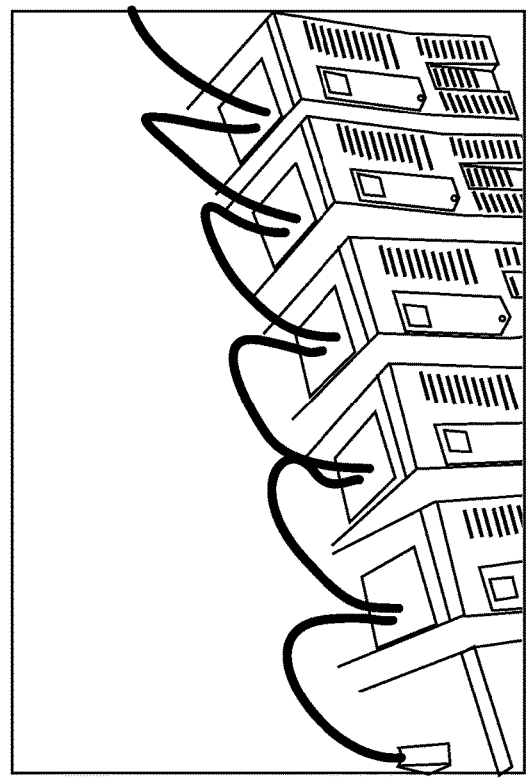
FIGS. 4A and 4B illustrate limited space available in real-life applications of servo motor controllers.
Figure 4B:
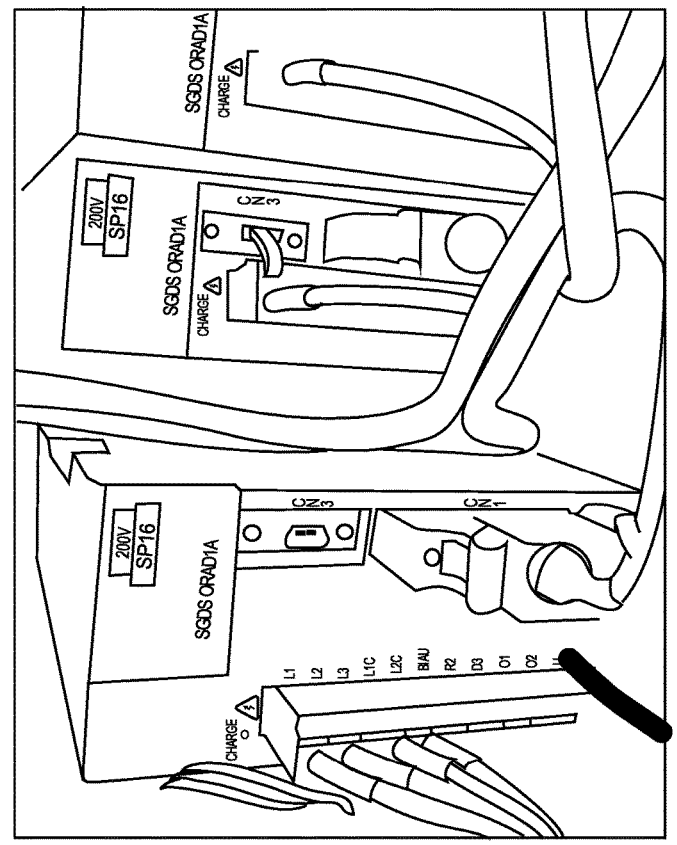

The disclosure is particularly applicable to a filter for a servo motor and it is in this context that the disclosure will be described. It will be appreciated, however, that the device and method has greater utility since it may be implemented in different manners and may also be used in other pulsed signal devices that use digital control signals, such as a servo motor or actuator, a variable frequency motor or actuator, a stepper motor or actuator and other similar types of electric motors and actuators.

A device and method for reducing ground currents and electromagnetic interference in servo and similar motors is described. In one embodiment, the device may include, in addition to regular filtering components and circuits, a separate noise-suppressing choke on a ground wire to reduce current in the ground line that causes damage to bearings and electrical overstress. The choke may be of a saturation type that offers high inductance and good noise-blocking properties in normal operating conditions and sufficiently low impedance at fail currents which provides proper tripping of safety circuits. In accordance with another embodiment, a motor filter may be combined with a power line filter in one enclosure in order to reduce required space and cost.

One aspect of the device and method is that the device may use of one or more common-mode inductors in a ground line instead of a differential inductor. The one or more common-mode inductors offer several magnitudes higher inductance than equivalent current differential inductors, are significantly less expensive than differential inductors and are physically smaller. For example, a common mode inductor made be Wurth (details of which are available at http://katalog.we-online.de/pbs/datasheet/7448243104310.pdf) can be purchased for about $3.50 in quantities, has a 10 mH inductance and is rated at 3 A and a size of 27.5 mm by 33 mm by 18.5 mm. In contrast, a 10 mH differential inductor rated at 3 A or higher may be found (http://www.hammondmfg.com/pdf/5c0032.pdf), but the differential inductor has a footprint that is 4"×2.25" If a lesser performance differential inductor is used (see http://www.vishay.com/docs/34015/ihb.pdf), the price is about $30 but the inductance is only 2.7 mH—almost four times worse and the size is larger—2" diameter footprint.

A common mode inductor/choke is an inductor in which two coils are wound on a single core and they pass differential currents (equal but opposite) while blocking common-mode currents. A differential mode inductor/choke is one or more in series with the supply line, the return line or both and they pass common mode currents while blocking differential currents. The reason that one or more common-mode inductors are used instead of the differential inductor is that currents in the opposite directions in its windings cause mutually-cancelled magnetic fields. However, common mode inductors cannot handle high differential current due to saturation of their core which is used in the device. The use of common mode inductors in a differential circuit of the ground line is possible because in normal operation ground current is substantially lower than the current in power lines and at high fault currents common mode core easily saturates effectively lowering inductance to close to zero. This is explained in more details below.

Figure 5A:
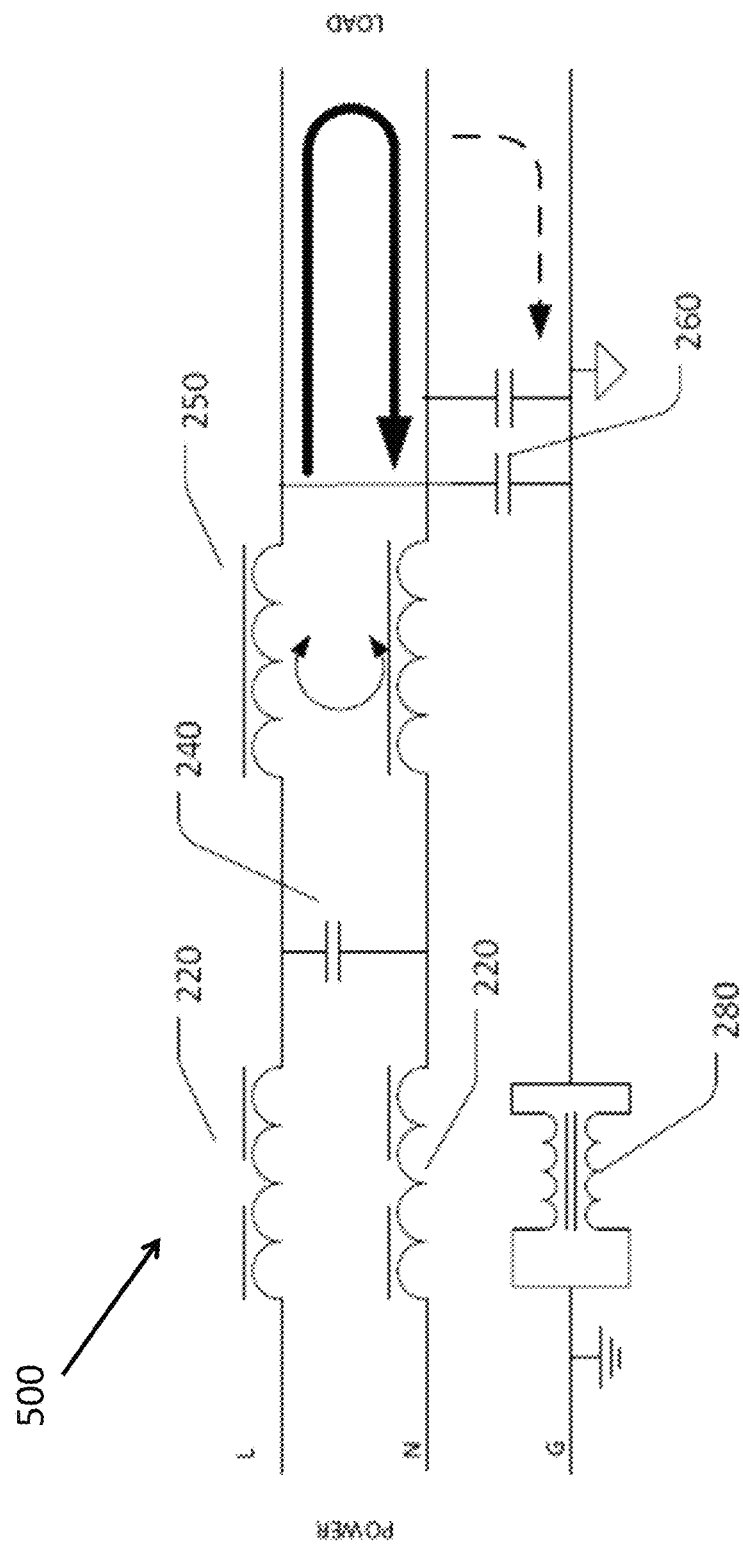
FIGS. 5A and 5B depicts a circuit diagram and current flow in a servo filter in normal operation and failure operation, respectively.

FIG. 5A depicts normal operation of a filter 500 with a common mode inductor in a ground line ("G".) The filter also has one or more differential inductors 220 on the power lines together with a capacitor 240 that form a differential mode filter stage. The filter also has a common mode inductor 250 and one or more capacitors 260 that form a common mode filter stage. The filter may also have a common mode inductor 280 on the ground line that provides reduction of high frequency current in the ground circuit. In normal operation, the main current in the load flows via inductors 220 and 250 as shown in FIG. 5A with a bold arrow and only small fraction of the current, called leakage current, flows through the inductor 280 and the ground circuit as shown in FIG. 5A by the dotted line arrow. Known safety regulations limit this leakage current to no more than few milliamperes. The common mode inductor 280 thus provides high insertion loss for high frequencies without any deterioration in its performance.

Figure 5B:
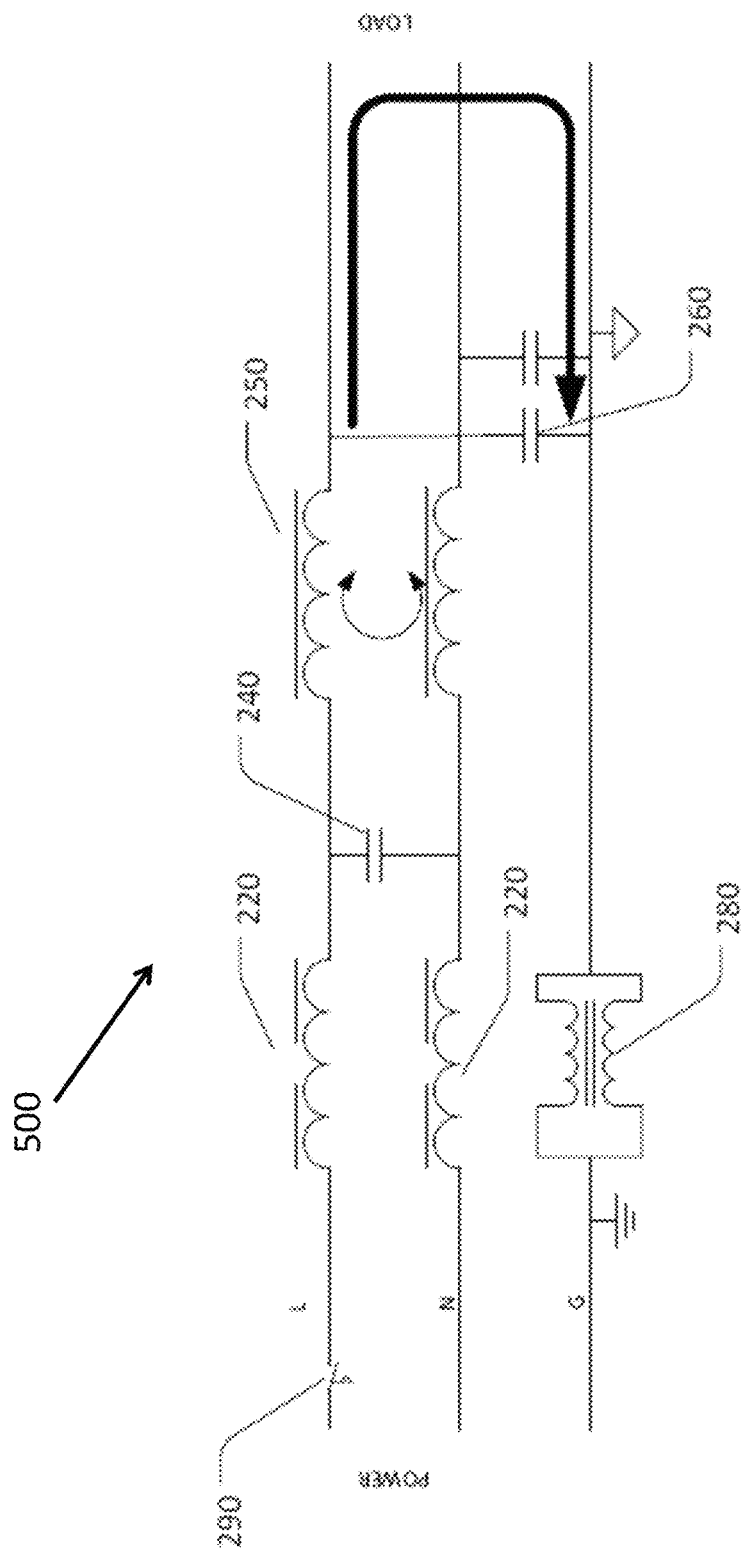

FIG. 5B depicts a failure mode of the filter 500 where a live circuit in the load is shorted to ground. In such a condition, a circuit breaker 290 should trigger and disconnect live circuit immediately. The current in the live circuit, in the case of such short-circuit situation, should be sufficient to activate that circuit breaker. If the impedance of ground line circuit is too high, the current may be limited and the circuit breaker may not trigger creating an unsafe situation. During normal operation, impedance of common mode inductor may be high for very low levels of AC currents, but at high current, the core of the common mode inductor 280 saturates rendering the impedance of inductor essentially equivalent to the resistance of the wires of the inductor—close to zero. Thus, the device and method achieves two objectives in one—good attenuation of high frequency currents in normal operation and safe low-impedance pathway in fail situations as described below. It should be noted that a differential inductor with low saturation current but with sufficient wire gage can also be utilized as the saturable inductor in ground circuit. However, differential inductors with combination of such properties (low saturation current and sufficiently large wire gage) are not easily obtainable unlike widely available common mode inductors and thus are more expensive and less obtainable. Therefore, this disclosure uses "common mode" definition of a saturable inductor as most practical implementation.

Figure 6:
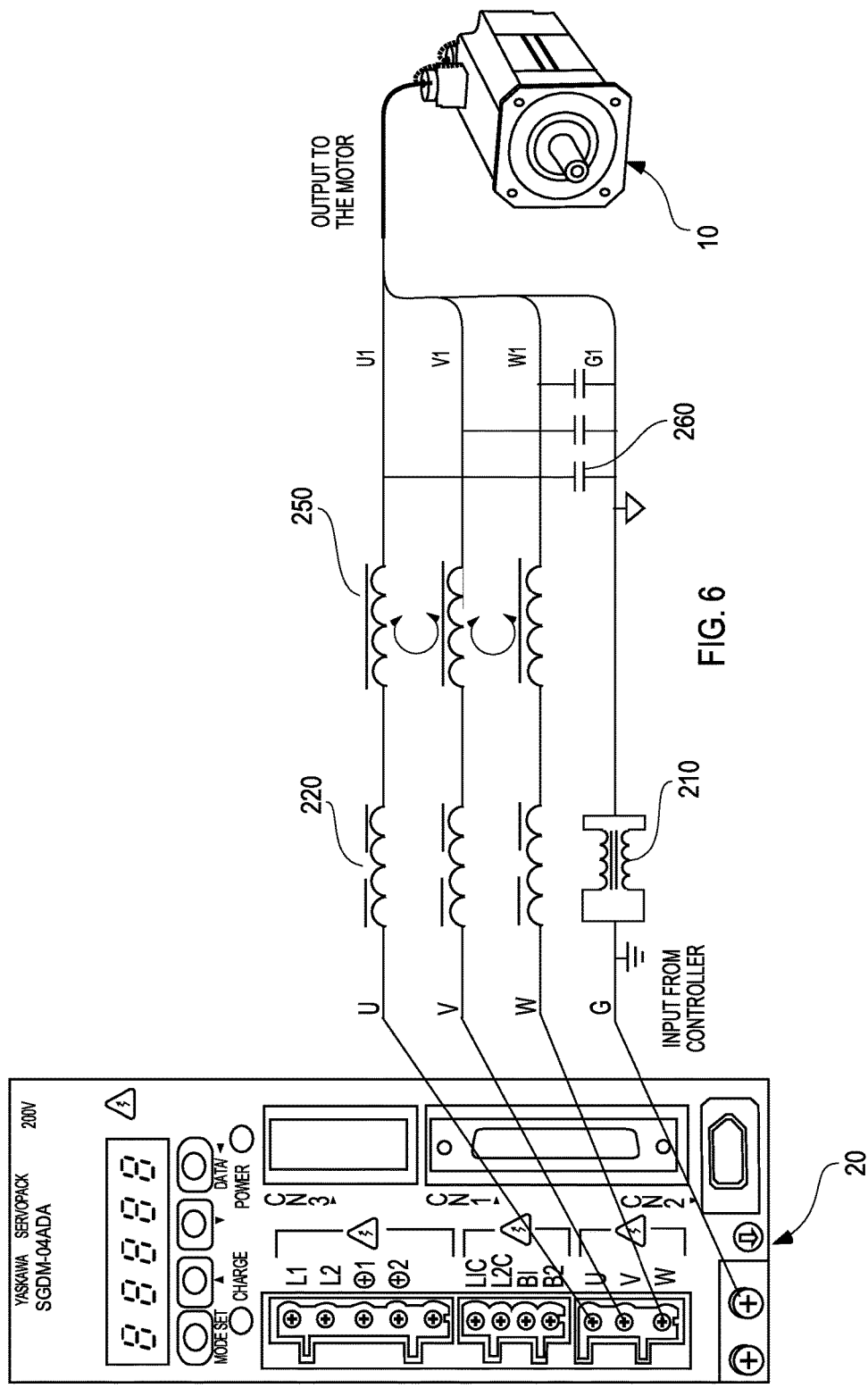
FIG. 6 illustrates a servo motor filter connected between a servo controller and a servo motor.

FIG. 6 depicts an electrical schematic of a device 600 that is coupled between a pulsed digital control signal device 10, such as a servo motor and a controller 20 of the pulsed digital control signal device, such as a servo motor controller. The device 600 may comprise a common mode inductor 210 in a ground line ("G"), one or more differential inductors 220 in the line for each phase of the motor drive signal (U, V and W lines, for example) and a three-phase common mode inductor 250 and one or more associated capacitors 260 for common mode suppression in each phase line. As shown in FIG. 6, windings of the common mode inductor 250 may be connected in parallel in order to increase effective wire gage and decrease impedance of the inductor in fail mode. For example, the impedance of a 10 mH inductor at 10 MHz (based on <100 nS rise and fall edges of drive pulses) is 628 kOhms—this offers a very significant insertion loss, or attenuation. For example, if a drive line shorts to ground, the current at worst case (highest frequency) of 20 kHz drive frequency and 200V would be 1.91 A which will saturate the core and the impedance will be that of a wire of inductor which is typically under 1 . . . 2 Ohms. Thus, the common mode inductor for this particular application is selected to have low saturation current which is still higher than normal leakage current (typically, ~5 mA). In the circuit, the increase in wire gage, in this example, is exactly twice because two identical windings are connected in parallel.

Figure 7:
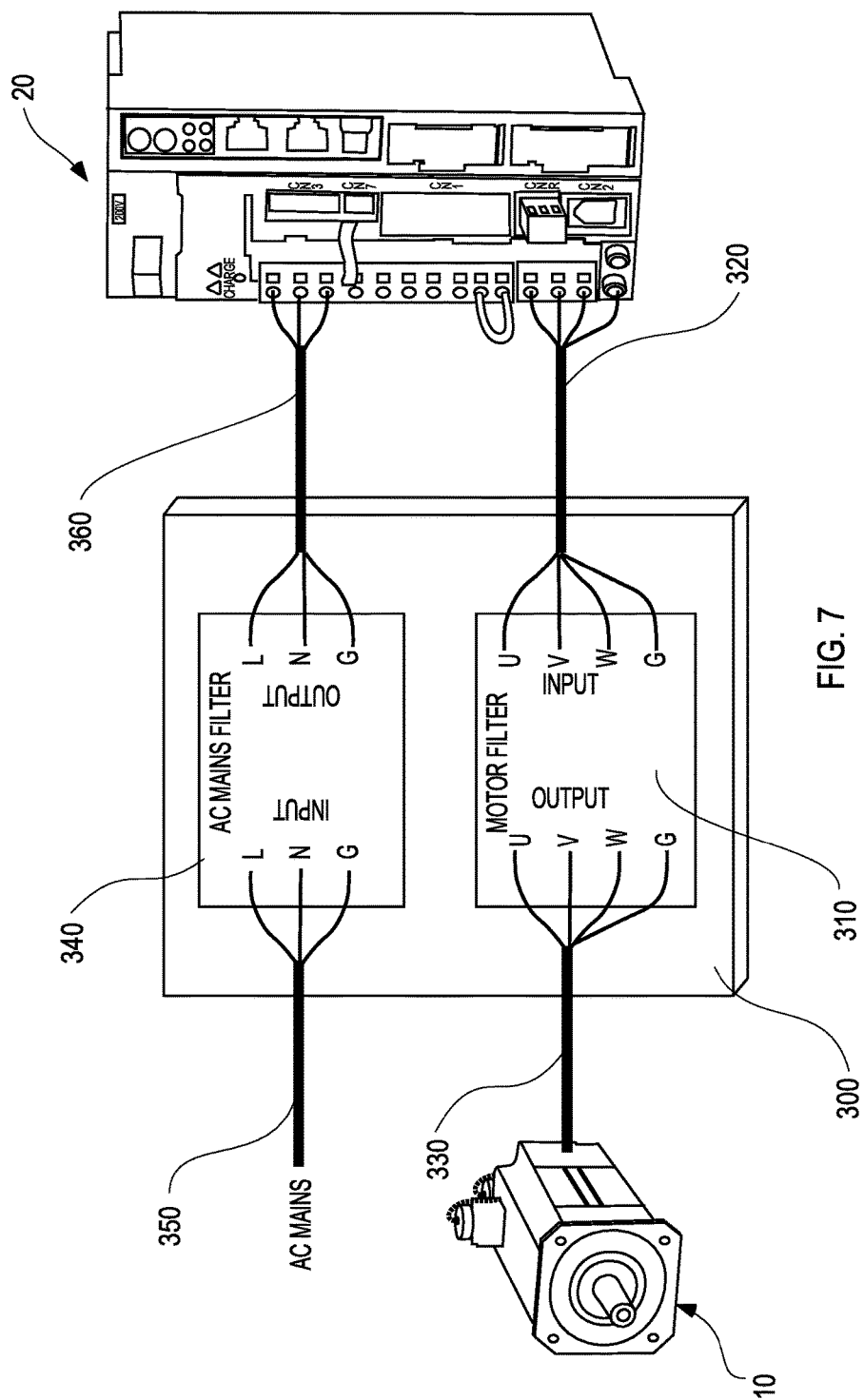
FIG. 7 is a block diagram of a combination servo filter/AC filter connected to a motor and to a controller.

Another aspect of the device and method is two filters in one enclosure as shown in FIG. 7. In one example, the device may have a servo motor filter and an AC mains filter. The device 300 may include a motor filter 310 that may be connected to said motor 10 and a servo controller 320 and an AC mains/power filter 340 that may be connected to AC mains/power lines 350 and to an AC input of the servo controller 20. The motor filter 310 may be implemented using the circuitry as shown in FIG. 6 and the AC mains filter component 340 may be implemented as three-phase filter or a DC filter, depending on the requirements of the servo controller.

Figure 8:
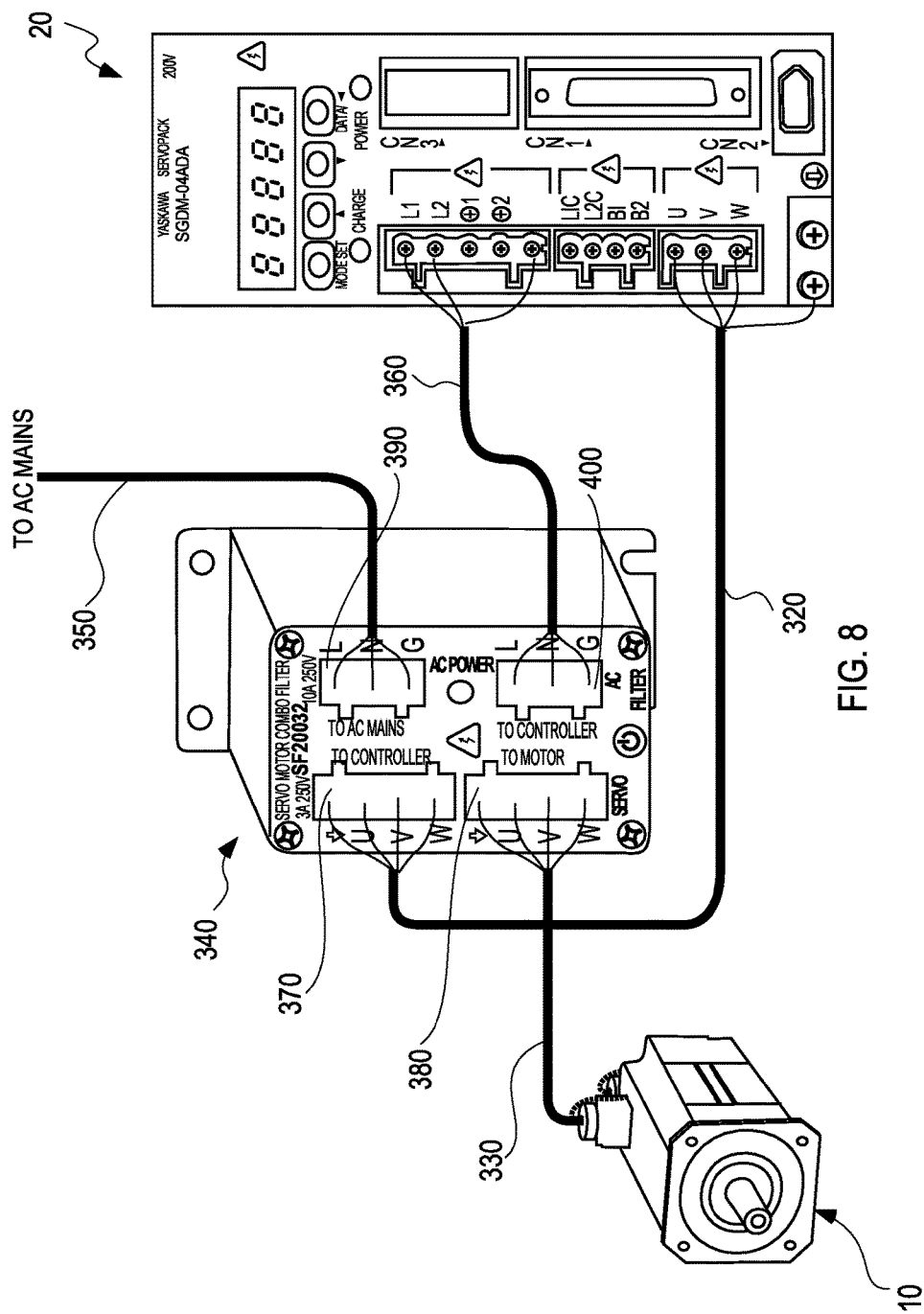
FIG. 8 shows one of the embodiments of of a combination filter of FIG. 7 connected to a motor and to a controller.

FIG. 8 depicts an example implementation of a device 340 (with both the motor filter and the AC main filter) connected to a servo motor 10 and a servo controller 20. The motor filter may be connected to the controller 20 with the cable 320 and with the motor using cable 330. AC filter section may be connected to the controller with the cable 340 and to the mains using cable 350. As seen, the motor filter section has input and output connectors 370 and 380 while AC section has input and output connectors 390 and 400 accordingly. Thus, using the device 340, only one device is required to fulfill the needs of a complete servo motor filtering applications.

Figure 11:
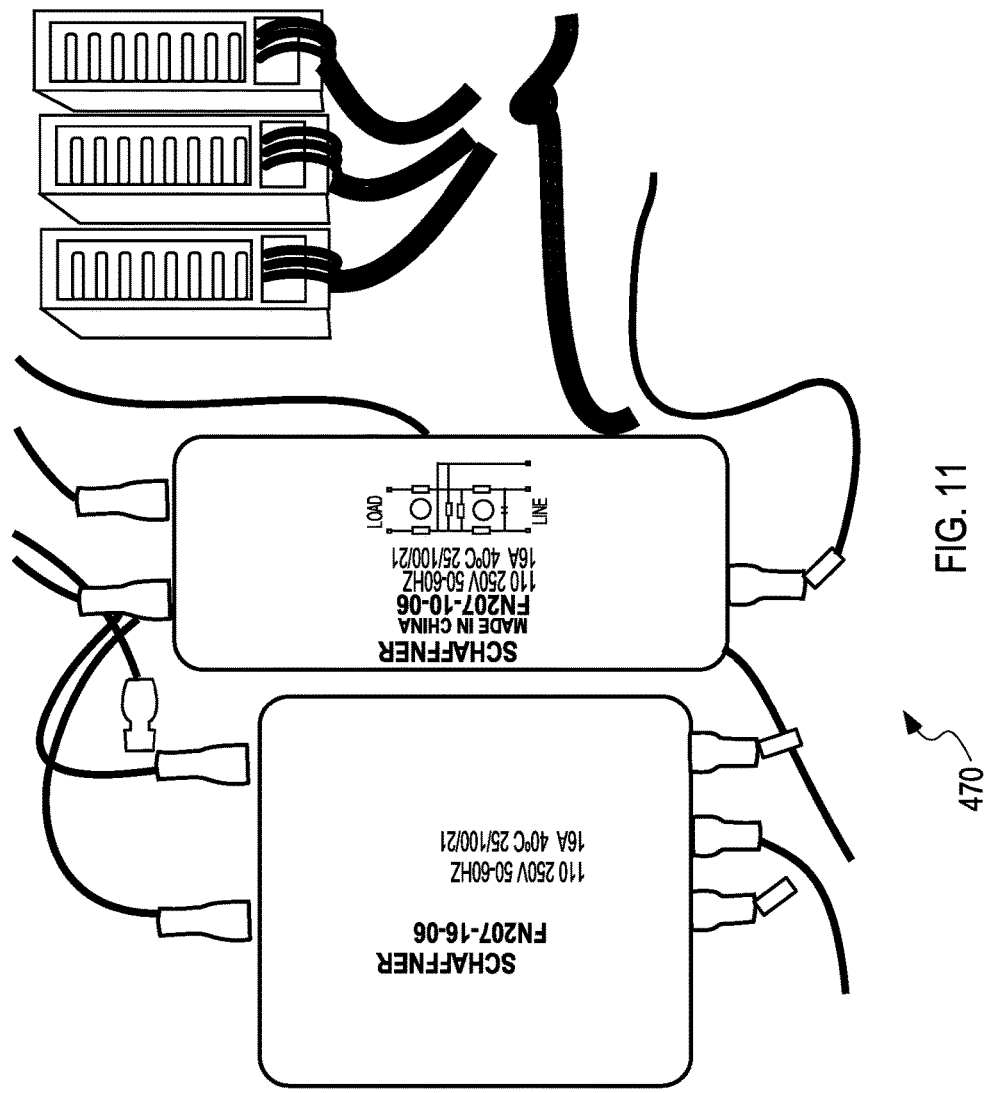
FIG. 11 shows a separate motor filter and an AC filter mounted in a product.

In order to fit two separate filters, the motor filter and the AC mains filter, into a small enclosure that would easily fit space-tight applications, two separate boards may be required. For example, the two filter boards may fit into an enclosure that is ~3" tall, 1.85" wide and 5" deep and the mounting footprint, which is the most critical parameter for space, is essentially ~1.85"×4". For purposes of comparison, the typical motor filter described in the background to Xenus may have a footprint of ~2.55"×4", but still requires an additional AC power line filter. In addition, for a 3 A motor filter, the power rating of the AC filter should be about 10 A and the footprint for a typical AC filter 6.14"×2.26" for Schaffner filter FN2070-10-06 (found at http://www.schaffner.com/en/products/datasheet-high-res/product/fn-2070-multi-stage-performance-emcemi-filter.html.) FIG. 11 shows a separate motor filter and an AC filter (the Schaffner filter) mounted in a product so that the device 340 may shink the space requirements for the filters by twice, if not more.

Figure 9A:
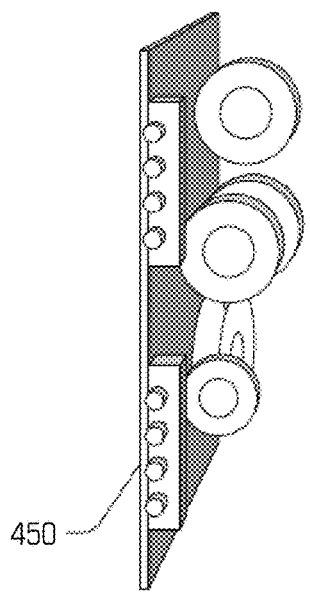
FIGS. 9A-9C depicts an internal construction of an embodiment of the combination filter including a first board, a second board and the packaged product, respectively.
Figure 9B:
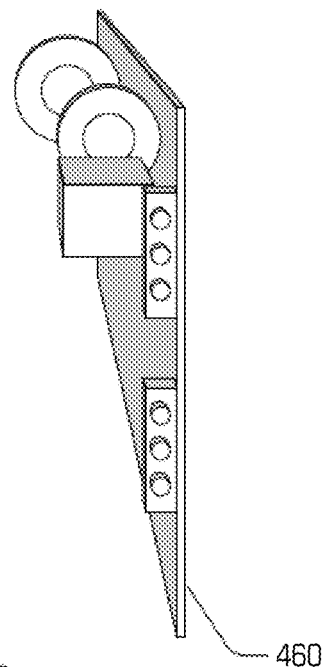
Figure 9C:
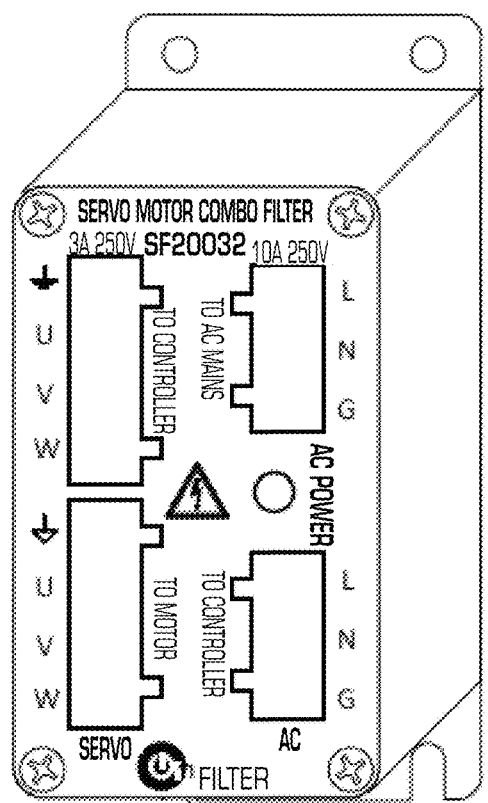
Figure 10B:
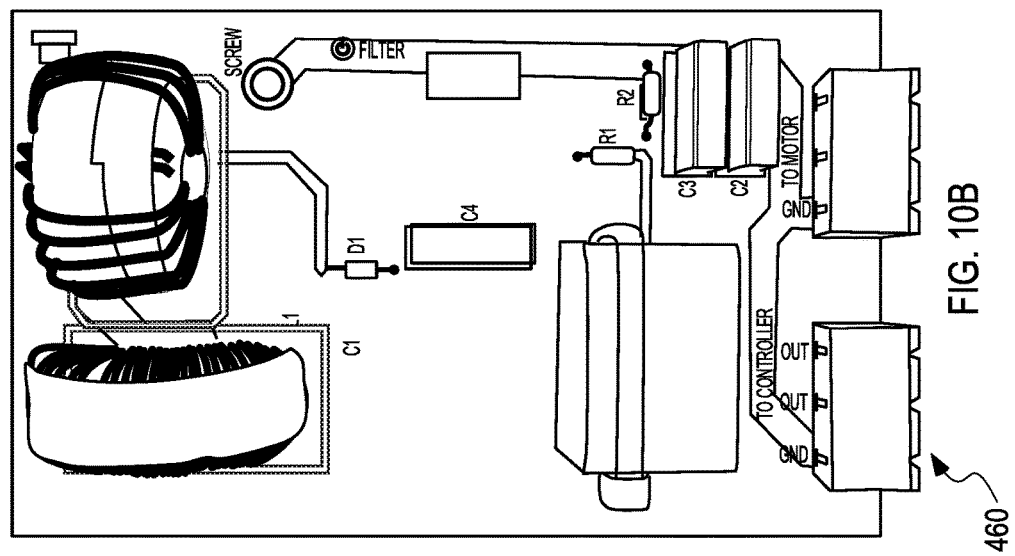
FIGS. 10A-10D depicts examples of the first board, the second board, the module with the two and second boards and the packaged product, respectively.
Figure 10A:
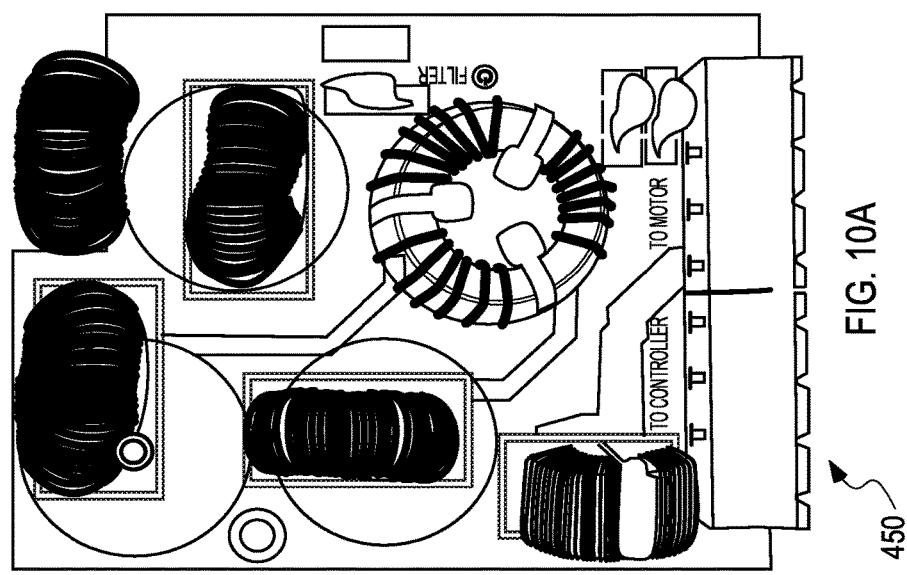
Figure 10D:
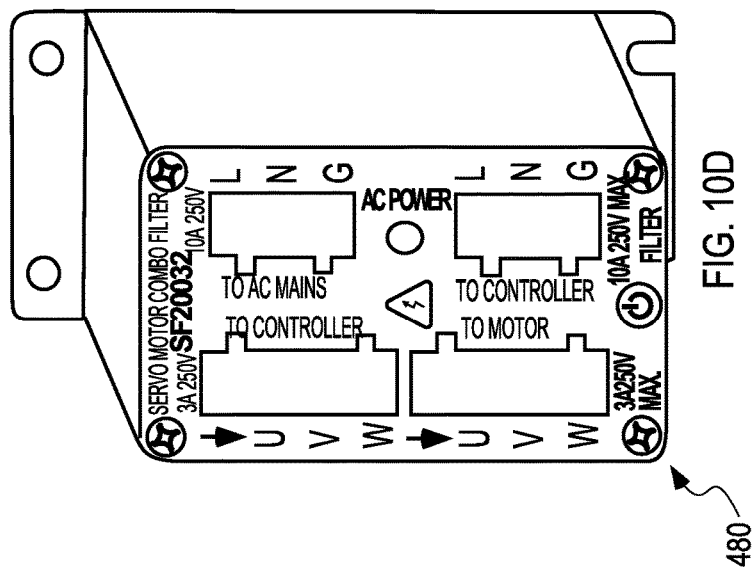
Figure 10C:
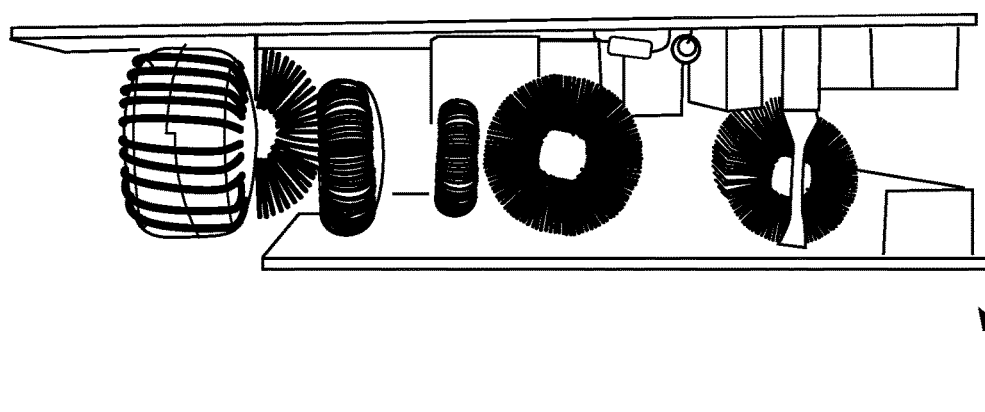

As shown in FIG. 9A, a motor filter board 450 is shown that has the connectors and inductors described above with reference to FIG. 6. FIG. 9B shows an AC mains filter board 460 that has the typical components for that filter including the inductors and the capacitors as well as connectors. As shown in the examples in FIGS. 9A and 9B, the boards are laid out in such way that elevated components on one board do not interfere with the components on the other board and the two boards may be easily sandwiched into a small package 340 as shown in FIG. 9C. FIG. 10 depicts an actual implementation of the device of FIG. 9. As seen, the motor filter board 450 (shown in FIG. 10A) and the AC filter board 460 (shown in FIG. 10B) can be easily sandwiched (shown in FIG. 10C) to make a compact filter 470 that fits into an enclosure normally suited for just one filter which is shown as 480 in FIG. 10D.

Figure 12:
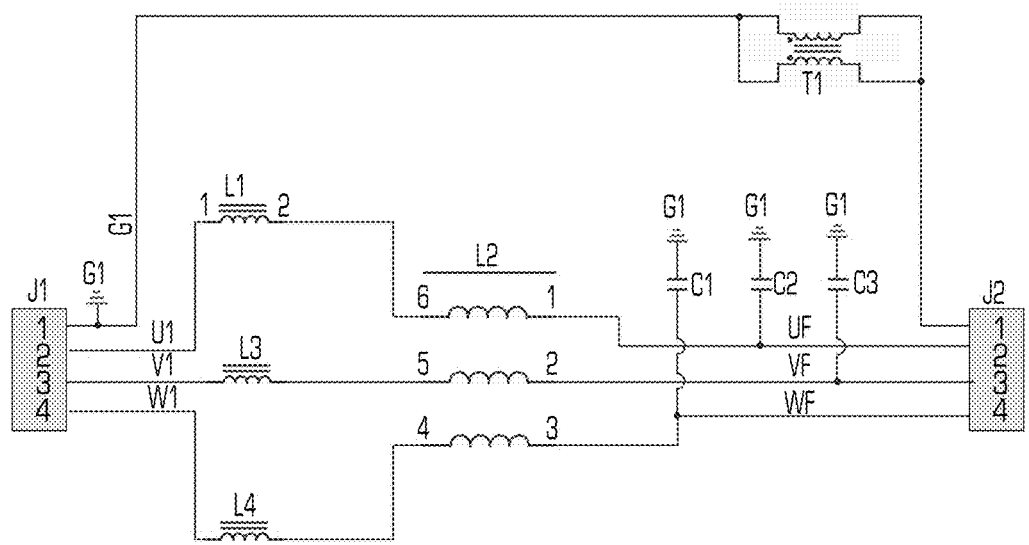
FIG. 12 is an example of a circuit schematic of the motor filter of the combination filter.
Figure 13:
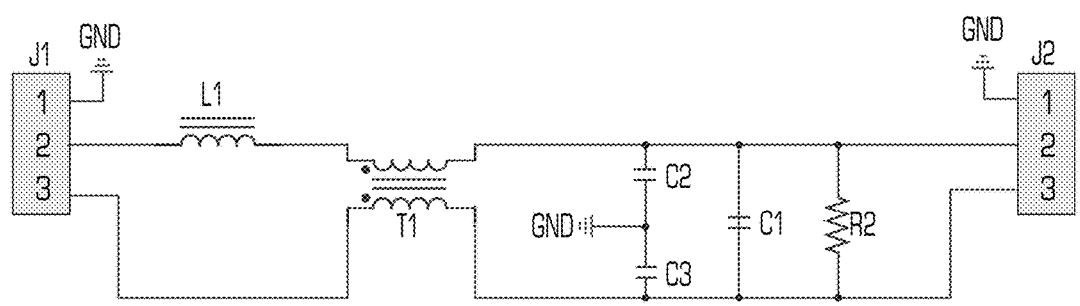
FIG. 13 is an example of a circuit schematic of the AC filter of the combination filter.

FIGS. 12 and 13 illustrate a circuit schematic for the motor filter and the AC filter, respectively for the implementations shown in FIGS. 9A-10D.

Figure 14A:
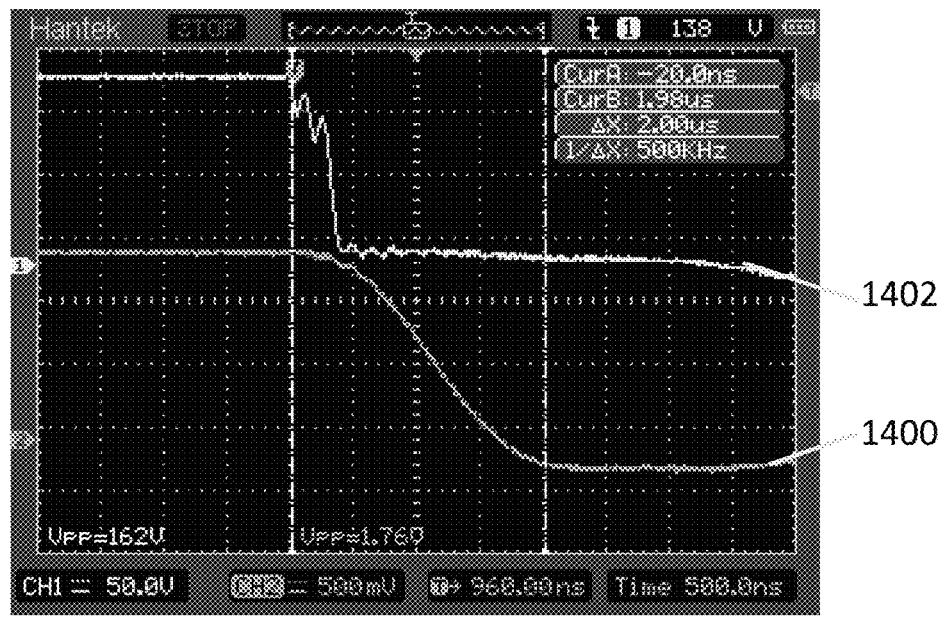
FIGS. 14A and 14B illustrate a change in voltage with and without the motor filter.
Figure 14B:
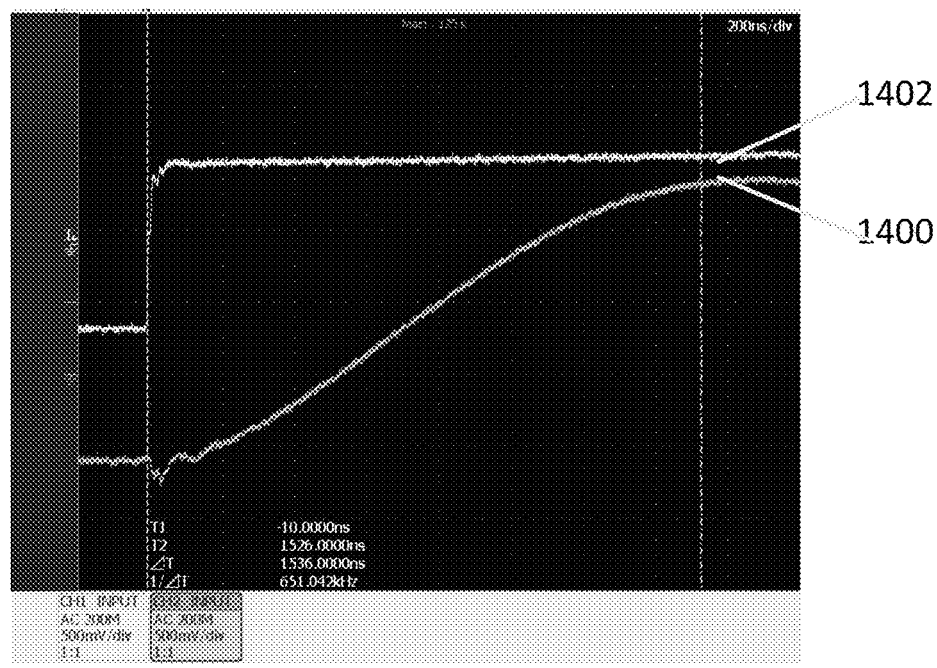

FIGS. 14A and 14B illustrate a change in voltage with and without the motor filter in which a first trace 1400 is before the filter and a second trace 1402 is after the filter. As seen in FIGS. 14A and 14B, the voltage trace 1402 with the filter is more gradual with longer rise and fall edges.

Figure 15A:
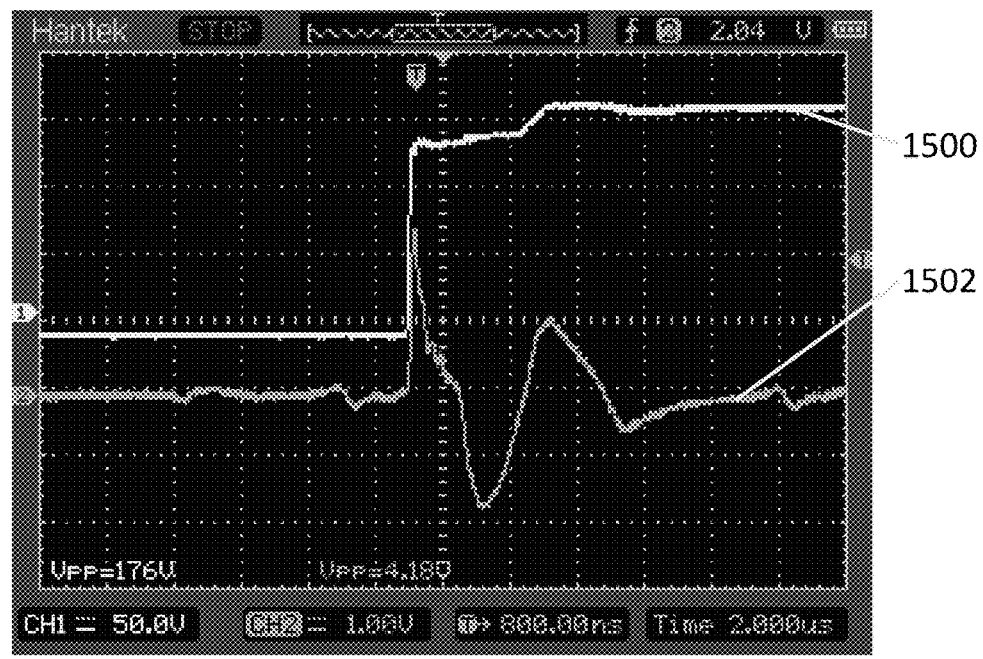
FIGS. 15A and 15B illustrate a ground current without the motor filter and with the motor filter, repectively.
Figure 15B:
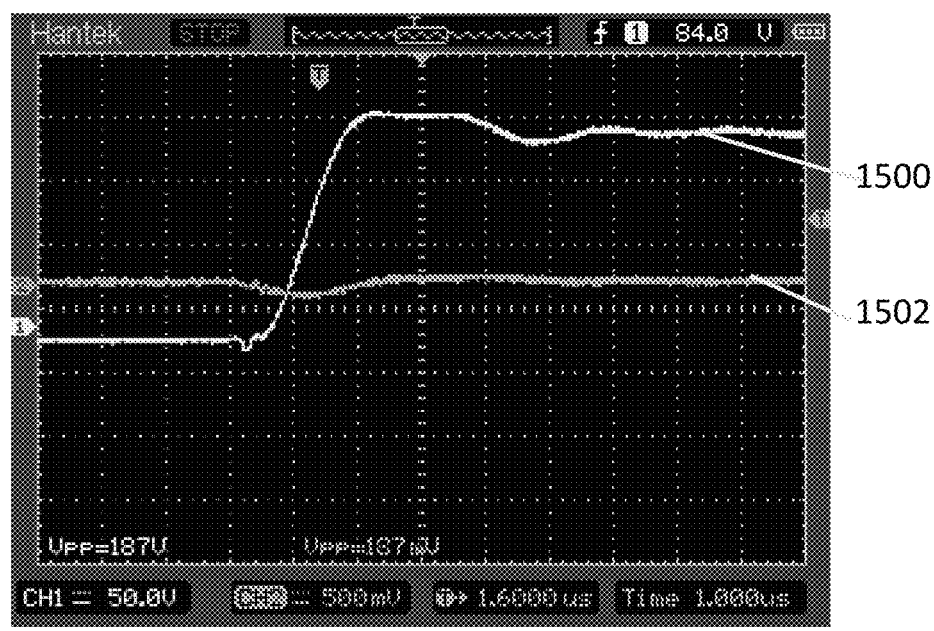

FIGS. 15A and 15B illustrate a ground current without the motor filter and with the motor filter, repectively. FIGS. 15A and 15B both show a drive signal to the motor 1500 and a current to ground line signal 1502. FIG. 15A shows those two signals without a filter while FIG. 15B shows those two signals with the motor filter of the disclosure. The current is measured in the ground line between servo controller and motor using current probe CT1 by Tektronix (http://www-.tek.com/sites/tek.com/files/media/media/resources/60 W_12572_2.pdf). This probe has transfer function of 5 mV/mA—per each mA of current it outputs SmV. Thus, in FIG. 15A (without the filter), the current in the ground line is 0.836 A while the current in the ground line in FIG. 15B (with the filter) is 0.0374 A. In addition, the edges of the drive pulses are smoothed when the filter is being used.

The foregoing description, for purpose of explanation, has been described with reference to specific embodiments. However, the illustrative discussions above are not intended to be exhaustive or to limit the disclosure to the precise forms disclosed. Many modifications and variations are possible in view of the above teachings. The embodiments were chosen and described in order to best explain the principles of the disclosure and its practical applications, to thereby enable others skilled in the art to best utilize the disclosure and various embodiments with various modifications as are suited to the particular use contemplated.

While the foregoing has been with reference to a particular embodiment of the disclosure, it will be appreciated by those skilled in the art that changes in this embodiment may be made without departing from the principles and spirit of the disclosure, the scope of which is defined by the appended claims.

The invention claimed is:

1. A device for reducing electrical noise from operation of a pulsed digital control signal device, the device comprising:
   one or more inductors, wherein each inductor is configured to be connected to a phase drive signal line of the pulsed digital control signal device, the pulsed digital control signal device having one or more phase drive signal lines; and
   a ground line inductor, separate from the one or more inductors, that is in a line different from the one or more phase drive signal lines and that is configured to be connected to a ground line of the pulsed digital control signal device, the ground line inductor being a saturable inductor having high impedance in normal operating conditions and having a core that saturates at fail currents resulting in low impedance at fail currents.

2. The device of claim 1, wherein the ground line inductor is a common mode inductor.

3. The device of claim 2, wherein the common mode inductor has windings connected in parallel in order to increase effective wire gage.

4. The device of claim 1, wherein the one or more inductors further comprise a differential inductor configured to be connected to each of the one or more phase drive signal lines.

5. The device of claim 4, wherein the one or more inductors further comprise a multi-phase common mode inductor configured to be connected to the one or more phase drive signal lines and a plurality of capacitors.

6. A device, comprising:
   a pulsed digital control signal device;
   one or more inductors, wherein each inductor is configured to be connected to a phase drive signal line of the pulsed digital control signal device, the pulsed digital control signal device having one or more phase drive signal lines; and
   a ground line inductor, separate from the one or more inductors, that is in a line different from the one or more phase drive signal lines and that is configured to be connected to a ground line of the pulsed digital control signal device, the ground line inductor being a saturable inductor having high impedance in normal operating conditions and having a core that saturates at fail currents resulting in low impedance at fail currents.

7. The device of claim 6, wherein the ground line inductor is a common mode inductor.

8. The device of claim 7, wherein the common mode inductor has windings thereof connected in parallel in order to increase effective wire gage.

9. The device of claim 6, wherein the one or more inductors further comprise a differential inductor configured to be connected to each of the one or more phase drive signal lines.

10. The device of claim 9, wherein the one or more inductors further comprise a multiple-phase common mode inductor configured to be connected to the one or more phase drive signal lines and a plurality of capacitors.

11. The device of claim 6, wherein the pulsed digital control signal device is one of a servo motor, a servo actuator, a variable frequency motor, a variable frequency actuator, a stepper motor and a stepper actuator.

12. A device, comprising:
   one or more inductors, wherein each inductor is configured to be connected to a signal line of a plurality of signal lines;
   a ground line inductor, separate from the one or more inductors, that is in a line different from the plurality of signal lines and that is configured to be connected to a ground line, the ground line inductor being a saturable common mode inductor having high impedance in normal operating conditions and having a core that saturates at fail currents resulting in low impedance at fail currents; and
   wherein the saturable common mode inductor has windings thereof connected in parallel in order to increase effective wire gage.

13. A device, comprising:
   a ground filter;
   the ground filter having a saturable common mode inductor that is in a line configured to be connected to a ground line, the saturable common mode inductor having high impedance in normal operating conditions and having a core that saturates at fail currents resulting in low impedance at fail currents; and
   wherein the common mode inductor has windings thereof connected in parallel in order to increase effective wire gage.

* * * * *